(12) United States Patent
Menolfi et al.

(10) Patent No.: US 8,170,157 B2
(45) Date of Patent: May 1, 2012

(54) LOW JITTER COMMUNICATION SYSTEM

(75) Inventors: Christian I. Menolfi, Langnau am Albis (CH); Martin Leo Schmatz, Rueschlikon (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1076 days.

(21) Appl. No.: 11/961,545

(22) Filed: Dec. 20, 2007

(65) Prior Publication Data
US 2008/0175344 A1    Jul. 24, 2008

(30) Foreign Application Priority Data
Dec. 20, 2006    (EP) .................................. 06126585

(51) Int. Cl.
*H04L 27/08* (2006.01)
(52) U.S. Cl. .................. 375/345; 327/291; 370/395.62; 370/516; 375/226; 375/371; 398/155; 702/69

(58) Field of Classification Search .................. None
See application file for complete search history.

(56) References Cited

U.S. PATENT DOCUMENTS

| | | | | |
|---|---|---|---|---|
| 5,103,185 A | * | 4/1992 | Arai .............................. | 327/292 |
| 5,594,241 A | * | 1/1997 | Li et al. .................... | 250/231.17 |
| 6,614,318 B1 | * | 9/2003 | Boecker ......................... | 331/17 |
| 2003/0197534 A1 | * | 10/2003 | Feng ............................. | 327/141 |

* cited by examiner

*Primary Examiner* — David C. Payne
*Assistant Examiner* — Adolf Dsouza
(74) *Attorney, Agent, or Firm* — William Stock; Anne Vachon Dougherty

(57) ABSTRACT

The communication system having a transmitter and a receiver, wherein the transmitter and the receiver are coupled by a clock channel and a data channel, wherein the clock channel is shorter than the data channel and wherein the receiver comprises a delay circuit for extracting a jitter signal from a clock channel signal, delaying the extracted jitter signal, and generating a receiver clock signal for the receiver by the delayed jitter signal.

13 Claims, 7 Drawing Sheets

Delay in clock channel ≠ delay in data channel

Delay in clock channel ≠ delay in data channel

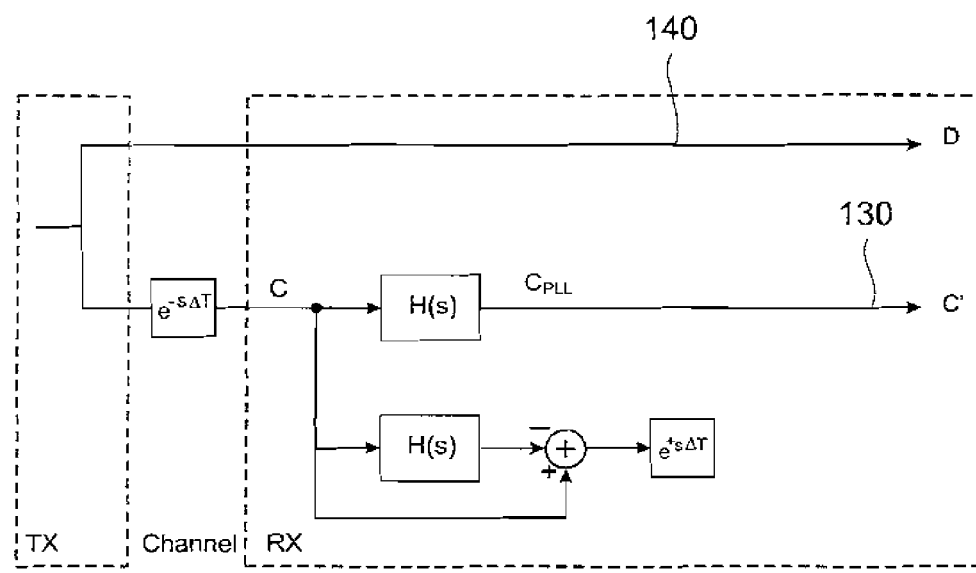
Fig.7 $\quad D - C' = (1 - e^{-s\Delta T})H(s)$

LOW JITTER COMMUNICATION SYSTEM

TECHNICAL FIELD

The invention relates to a communication system comprising a transmitter and a receiver, wherein the transmitter and the receiver are coupled by means of a clock channel and a data channel. Such communication systems are also denoted as source-synchronous communication systems. The invention further relates to a receiver for a source-synchronous communication system and a method for synchronizing a clock channel signal and a data channel signal of a source-synchronous communication channel.

BACKGROUND OF THE INVENTION

Source-synchronous communications systems are, for example, used in computer systems as source-synchronous data links to connect the memory to the processor. Details of such source-synchronous data links are e.g. specified in the JEDEC FB-DIMM standard.

In source synchronous communication systems a clock signal is sent over a clock channel along with a number of data signals over a data channel. Jitter in the transmitter that may be caused by a phase locked loop (PLL)-jitter or supply noise is observed in the timing of both the clock channel and the data channel. Source-synchronous communication systems benefit from the correlation between the clock channel and the data channel. This correlation is lost however if there is a difference in the travel time between clock and data. This difference is also denoted as propagation delay time difference.

This propagation delay time difference is mainly caused by different routing paths on the printed circuit boards. At certain frequencies, this may lead to the effect of jitter amplification. In other words, the timing between the data channel signal and the clock channel signal not only loses the correlation, but, even worse, at those certain frequencies the correlation may be negative.

One known solution is to introduce a PLL in the clock path at the receiver. This PLL filters out the high-frequency jitter of the clock channel signal. Hence, noise in the frequency band where negative correlation can appear, is cut off. However, also all correlation information above the PLL bandwidth is lost.

Another known solution is to delay the received clock signal by the actual clock-to-data skew by means of a high-precision delay line. This consumes a large amount of power and chip area and suffers from power supply noise.

It is an object of the invention to provide other solutions for source-synchronous communication systems.

It is a further object of the invention to provide an improved communication system comprising a transmitter and a receiver, wherein the transmitter and the receiver are coupled by means of a clock channel and a data channel. It is a further object of the invention to provide an improved receiver for such a communication system. It is a further object of the invention to provide an improved method for synchronizing a clock channel signal and a data channel signal of a source-synchronous communication channel.

SUMMARY AND ADVANTAGES OF THE INVENTION

The present invention is directed to a communication system, a receiver and a method as defined in independent claims. Further embodiments of the invention are provided in the appended dependent claims.

According to a first aspect of the invention there is provided a communication system comprising a transmitter and a receiver, wherein the transmitter and the receiver are coupled by means of a clock channel and a data channel, wherein the clock channel is shorter than the data channel, wherein the receiver comprises a delay circuit and wherein the delay circuit is provided for
- extracting a jitter signal from a clock channel signal,
- delaying the extracted jitter signal,
- generating a receiver clock signal for the receiver by means of the delayed jitter signal.

The clock channel and the data channel of the communication system according to this aspect of the invention may be used to establish a source-synchronous communication between the transmitter and the receiver. In other words, the transmitter may send in parallel a data signal, also denoted as data channel signal, over the data channel and a corresponding clock signal, also denoted as clock channel signal, over the clock channel.

The clock channel of the communication system is shorter than the data channel. In other words, the propagation delay time of the clock channel signal is shorter than the propagation delay time of the corresponding, correlated data channel signal.

The difference in the propagation delay time results in a different propagation delay time of jitter signals as well. By means of the delay circuit adverse influences on the timing between the data signal and the clock signal caused by the different jitter propagation delay times can be reduced or avoided. This allows reestablishing the correlation between the clock signal and the data signal in the receiver. This avoids or reduces sampling errors.

According to an embodiment of the first aspect of the invention the extracted jitter signal is delayed by the propagation delay time difference of the clock channel and the data channel.

This results in an optimal correlation between the clock channel signal and the data channel signal.

According to a further embodiment of the first aspect of the invention as jitter signal one or more parts of the jitter spectrum are extracted from the clock channel signal and the receiver clock signal is generated by means of adding the delayed parts of the jitter spectrum to the difference signal of the clock channel signal and the non-delayed extracted jitter signal.

Extracting only one or more parts of the jitter spectrum allows adapting the delay circuit for the respective features of the clock channel, the data channel and the application. In particular it offers the possibility to extract the parts of the jitter spectrum that have a negative or an especially negative effect on the timing between the data channel signal and the clock channel signal.

According to further embodiment of the first aspect of the invention as jitter signal a high frequency spectrum is extracted from the clock channel signal by means of a high pass filter.

This embodiment is based on the realization that high frequency jitter has worse effects on the timing of the clock channel signal than low frequency jitter due to the difference in the propagation delay.

According to a further embodiment of the first aspect of the invention as jitter signal substantially the whole jitter spectrum is extracted from the clock channel signal and the receiver clock signal is generated by means of adding the extracted jitter spectrum to a substantially clean clock reference signal.

According to this embodiment adverse jitter effects on the timing between the data channel signal and the clock channel signal may be substantially eliminated. However, a substantially clean clock reference has to be provided for this embodiment. A substantially clean clock reference signal is a signal that comprises substantially no jitter. It may be derived from an external substantially clean reference clock or derived from the clock channel signal by means of a substantially ideal PLL.

According to a further embodiment of the first aspect of the invention the high pass filter is implemented by means of a phase locked loop comprising a phase detector, a loop filter and a voltage controlled oscillator and the phase detector is provided for receiving the clock channel signal and for delivering as output signal the extracted jitter signal.

This is an efficient and cost effective solution for the high pass filter. The phase detector receives as input the clock channel signal from the clock channel and the output of the voltage controlled oscillator and determines the phase difference between these two signals. This provides a high pass filter for the clock channel signal.

According to a further embodiment of this embodiment the difference signal of the clock channel signal and the non-delayed extracted jitter signal is derived from the voltage controlled oscillator of the phase locked loop.

According to this embodiment the output of the voltage controlled oscillator provides as difference signal the low-pass filtered clock channel signal.

According to a further embodiment of the first aspect of the invention the cut-off frequency of the high pass filter is selected in dependence on the propagation delay time difference between the clock channel and the data channel.

This embodiment is based on the realization that high frequency jitter has worse effects on the timing of the clock channel signal than low frequency jitter and that furthermore the adverse effect is dependent on the propagation delay time difference between the clock channel and the data channel. The longer the propagation delay time difference, the more influence the low-pass jitter gets and the lower the cut-off frequency of the high pass filter should be chosen.

According to a further embodiment of the first aspect of the invention the delay circuit comprises a coarse delay unit for performing a coarse delay of the extracted jitter signal.

The coarse delay unit can preferably be implemented by means of a First-In-First-Out (FIFO) shift register. Such a FIFO can be implemented analog or digital. The delay of the coarse delay unit should preferably correspond to the propagation delay time difference of the clock channel and the data channel.

According to a further embodiment of the first aspect of the invention the delay circuit comprises a controllable delay buffer for adding the extracted and delayed jitter signal to the difference signal or the substantially clean reference signal.

The controllable delay buffer receives as input the extracted jitter signal, e.g. the extracted high frequency jitter spectrum, and the difference signal or the substantially clean reference signal. Then the delay buffer adds the extracted jitter signal to the difference signal or the substantially clean reference signal. As an example, if the extracted jitter signal comprises a sudden phase jump, this sudden phase jump is delayed by the coarse delay unit and then added to the difference signal or the clean reference signal by the controllable delay buffer.

According to a further embodiment of the first aspect of the invention the delay circuit comprises an injection unit for injecting the extracted and delayed jitter signal to the control voltage of the voltage controlled oscillator.

The controllable injection unit receives as input the extracted and delayed jitter signal and injects, in other words adds the extracted jitter signal to the control voltage of the VCO. This results in an addition of the extracted and delayed jitter signal to the output signal of the VCO, i.e. to the difference signal.

According to a second aspect of the invention there is provided a receiver for a source-synchronous communication system, wherein the receiver comprises a delay circuit and wherein the delay circuit is provided for extracting a jitter signal from a received clock channel signal, delaying the extracted jitter signal, generating a receiver clock signal for the receiver by means of the delayed jitter signal.

According to a third aspect of the invention there is provided a method for synchronizing a clock channel signal and a data channel signal of a source-synchronous communication channel, wherein the clock channel and the data channel comprise a propagation delay time difference, the method comprising the steps of:

receiving the clock channel signal and the data channel signal, extracting a jitter signal from the received clock channel signal, delaying the extracted jitter signal, generating a receiver clock signal by means of the delayed jitter signal.

Any of the device features may be applied to the method aspect of the invention and vice versa. Advantages of the device features apply to corresponding method features and vice versa.

DESCRIPTION OF THE DRAWINGS

Preferred embodiments of the present invention are described in detail below, by way of example only, with reference to the following schematic drawings, in which:

FIG. 7 shows a mathematical model of the receiver of FIG. 5.

The drawings are provided for illustrative purpose only and do not necessarily represent practical examples of the present invention to scale. In the figures, same reference signs are used to denote the same or like parts.

FIG. 1 shows a block diagram of a communication system 100 according to an embodiment of the invention. The communication system 100 comprises a transmitter 110 and a receiver 120. The transmitter 110 and the receiver 120 are coupled by means of a clock channel 130 and a data channel 140. The clock channel 130 is shorter than the data channel 140. This results in a propagation delay time difference $\tau_d$ between the propagation delay time of the clock channel 130 and the propagation delay time of the data channel 140. The transmitter 110 is provided for transmitting in parallel a data channel signal d over the data channel 140 and a corresponding clock channel signal c over the clock channel 130. The communication system 100 is hence a source-synchronous communication system.

Figure 1:
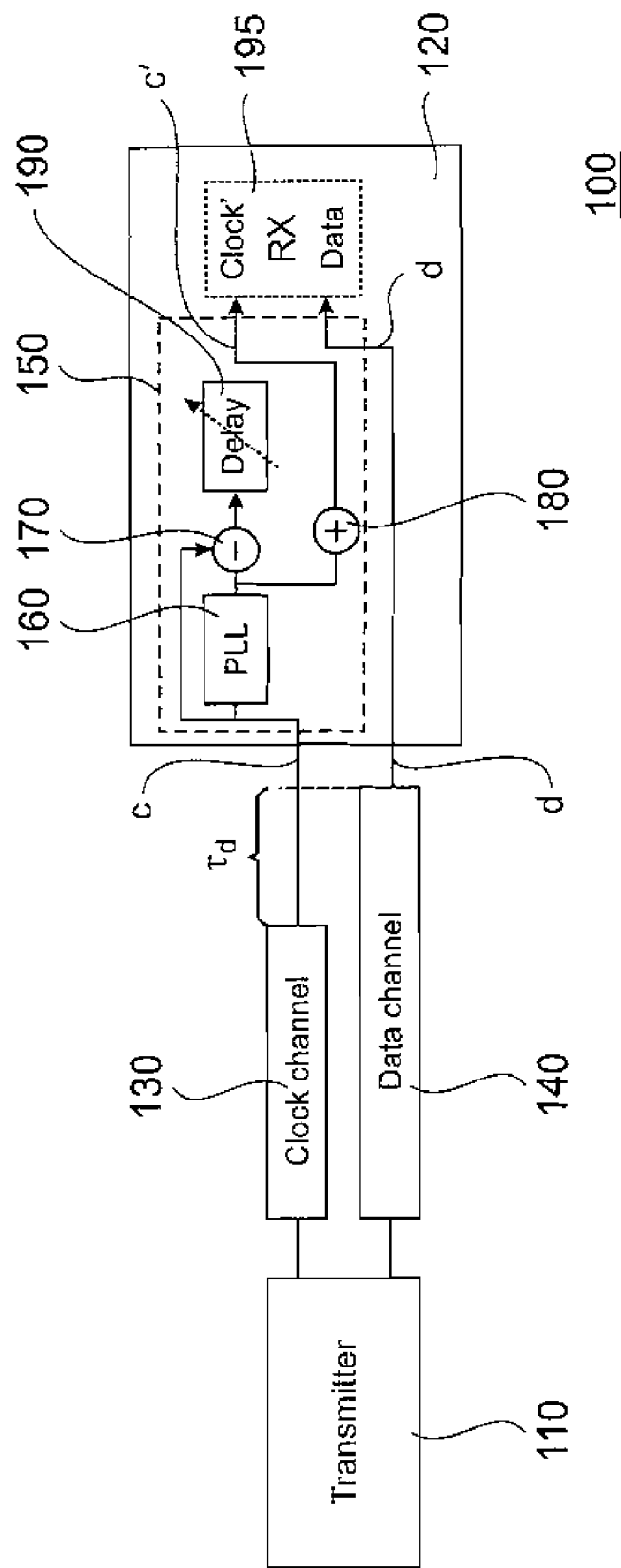
FIG. 1 shows a block diagram of a communication system according to an embodiment of the invention comprising a transmitter and a receiver, wherein the transmitter and the receiver are coupled by means of a clock channel and a data channel and the clock channel is shorter than the data channel.

The receiver 120 comprises a delay circuit 150. The delay circuit 150 comprises a phase locked loop (PLL) 160, a subtraction unit 170, a summation unit 180 and a coarse delay unit 190. The PLL 160 is provided for receiving as input the clock channel signal c that has been transmitted over the clock channel 130. The output of the PLL 160 is coupled to a first input of the subtraction unit 170 and to a first input of the summation unit 180. The input of the PLL 160 is coupled to the second input of the subtraction unit 170. The output of the subtraction unit 170 is coupled to the input of the coarse delay unit 190. The output of the coarse delay unit 190 is coupled to the second input of the summation unit 180. The output of the summation unit 180 is coupled to the input of a main receiver circuit 195. The main receiver circuit 195 is furthermore directly coupled to the data channel 140.

The delay circuit 150 is provided for receiving the clock channel signal c, extracting as jitter signal a part of the jitter spectrum from the clock channel signal c, delaying the extracted part of the jitter spectrum and generating a receiver clock signal c' for the main receiver circuit 195 by means of the delayed part of the jitter spectrum. According to this exemplary embodiment of the invention the PLL 160 serves as low pass filter for the clock channel signal c. The subtraction unit 170 subtracts the low-pass filtered clock channel signal derived from the output of the PLL 160 from the original clock channel signal c received from the clock channel 130. Hence the PLL 160 and the subtraction unit 170 serve as high pass filter for the clock channel signal c and extract a high frequency spectrum from the clock channel signal c.

The extracted high frequency spectrum of the jitter spectrum is delayed by means of the coarse delay unit 190. The coarse delay unit 190 may be implemented as First-In-First-Out (FIFO) shift register. The coarse delay unit 190 delays the extracted high frequency spectrum of the jitter spectrum by the propagation delay time difference $\tau_d$ of the clock channel 130 and the data channel 140. The propagation delay time difference $\tau_d$ may be e.g. determined from the routing or layout of the data channel 140 and the clock channel 130. The summation unit 180 adds the delayed high frequency part of the jitter spectrum to the difference signal of the clock channel signal c and the non-delayed high frequency part of the jitter spectrum. In other words, the summation unit 180 adds the delayed high frequency part of the jitter spectrum to the low pass filtered output signal of the PLL 160. The output signal c' of the summation unit 180 is provided as receiver clock signal c' to the main receiver circuit 195. Hence the main receiver circuit 195 receives as input signals the receiver clock signal c' from the delay circuit 150 and the data signal d from the data channel 140.

Figure 2:
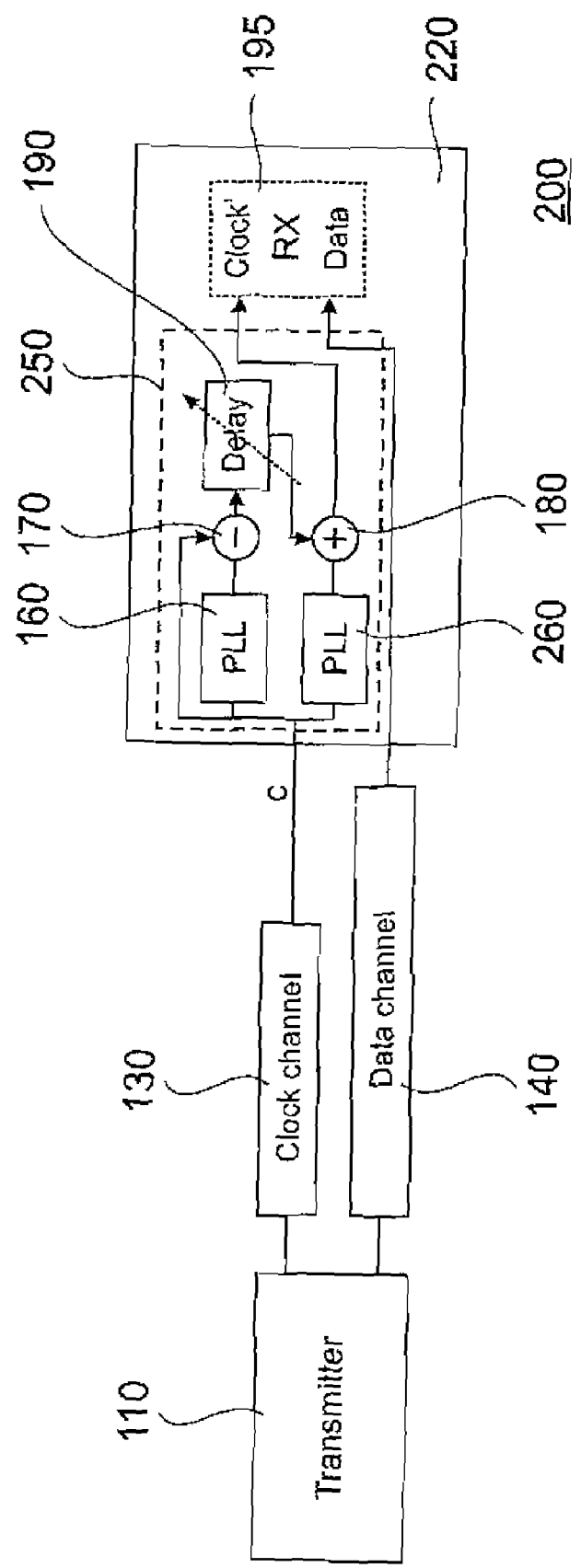
FIG. 2a shows block diagram of a communication system according to another embodiment of the invention.

FIG. 2 shows a block diagram of a communication system 200 according to another embodiment of the invention. The communication system 200 corresponds in most parts with the communication system 100 of FIG. 1. Accordingly, the same reference signs are used to denote the same or like parts. The communication system 200 comprises a receiver 220 with a delay circuit 250. The delay circuit 250 comprises a first PLL 160 and a second PLL 260. The first PLL 160 and the second PLL 260 have identical or very similar characteristics and receive both the clock channel signal c. Hence the output signal of the first PLL 160 and the second PLL 260 are very similar or identical as well. Instead of providing the output signal of the first PLL 160 to the summation unit 180, the output signal of the second PLL 260 is provided to the summation unit 180. The second PLL 260 serves hence as duplication stage or duplication unit for the first PLL 160.

Figure 3:
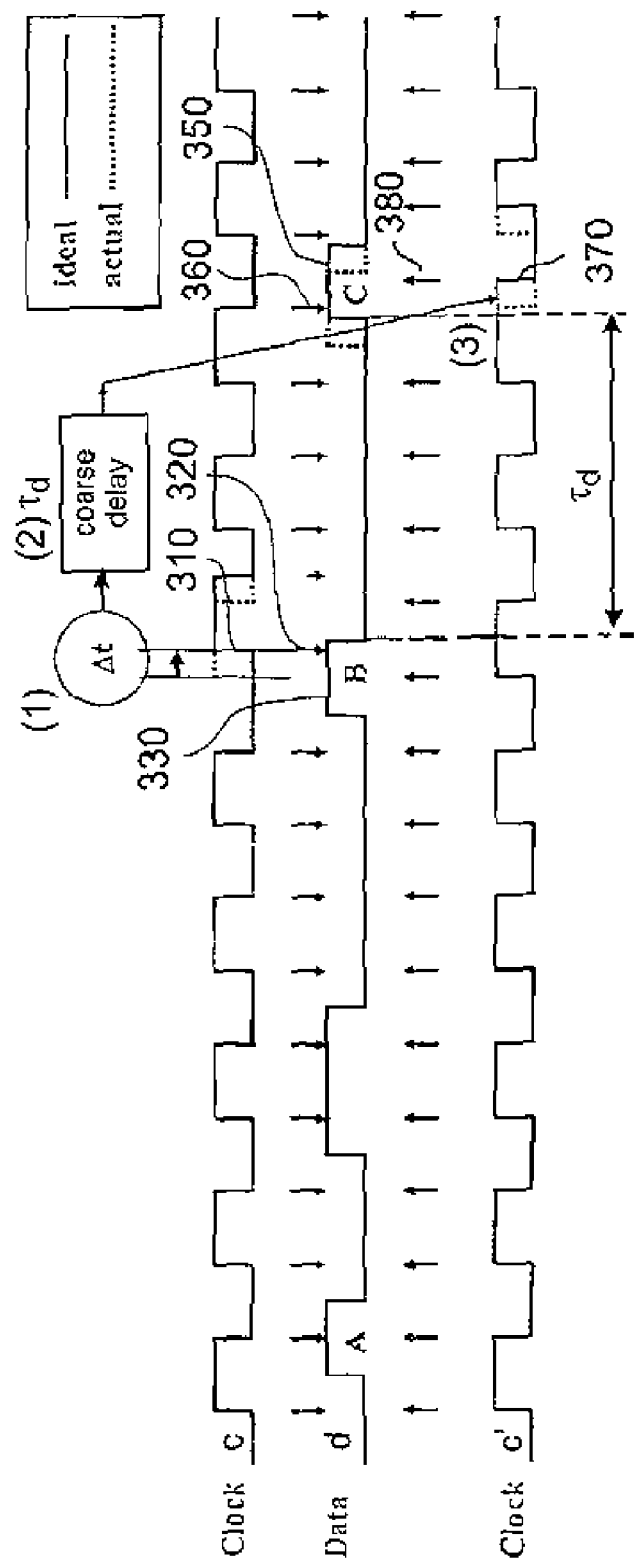
FIG. 3 illustrates schematically the function of a delay circuit of a receiver according to an embodiment of the invention by means of timing diagrams of clock and data channel signals.

FIG. 3 illustrates schematically the function of the delay circuit 150 of FIG. 1 by means of timing diagrams of clock and data channel signals. The upper part of FIG. 3 shows a timing diagram of a clock channel signal c received at the input of the receiver 120, i.e. at the input of the delay circuit 150. The middle part of FIG. 3 shows a timing diagram of a data channel signal received at the input of the receiver 120. The lower part of FIG. 3 shows a timing diagram of a clock channel signal c' at the output of the delay circuit 150.

The edges of the clock channel signal c are provided for generating trigger signals for sampling the data channel signal d. The trigger signals are illustrated with arrows in FIG. 3. In section A of the data signal d a normal sampling event is illustrated, i.e. a sampling event where the data bit is sampled in the middle. For the situation A it is assumed that no jitter occurs or only a low frequency jitter that does not adversely affect the sampling. In section B a situation is illustrated where a high frequency jitter occurs in the clock channel signal c. This high frequency jitter causes a delay Δt of the rising edge 310 of the clock channel signal c. Accordingly the trigger signal 320 for sampling the data channel signal d is delayed by Δt as well and the sampling of the data bit 330 does not take place in the middle of this data bit 330, but close to the edge of the data bit 330. This could cause sampling errors. The high frequency jitter propagates on the data channel as well, but reaches the receiver with a delay $\tau_d$ corresponding to the propagation delay time difference $\tau_d$ between the propagation delay time of the clock channel 130 and the propagation delay time of the data channel 140. This is illustrated in section C. This high frequency jitter causes a delay Δt of the data bit 350 of the data channel signal d. Accordingly the trigger signal 360 for sampling the data channel signal d does not take place in the middle of this data bit 360, but close to the edge of the data bit 360. This could again cause sampling errors.

By means of the delay circuit 150 as described with reference to FIG. 1, the high frequency jitter, i.e. the phase jump of the clock channel signal c and the delayed phase jump in the data channel signal d, is extracted from the clock channel signal c and delayed by means of the coarse delay unit 190 by the propagation delay time difference $\tau_d$. This has the effect that in the clock channel signal c' the high frequency jitter and the corresponding phase jump Δt occurs delayed by the propagation delay time difference $\tau_d$ as well. Hence the timing correlation between the data channel signal d and the clock channel signal c' is reestablished. As can be seen in FIG. 3, the falling edge 370 of the receiver clock signal c' triggers a trigger signal 380. The trigger signal 380 for sampling the data bit 350 of the data channel signal d does take place in the middle of this data bit 350. Hence sampling errors are avoided.

FIG. 4a to 4e illustrate schematically the function of a delay circuit of a receiver according to an embodiment of the invention in the frequency domain. The y-axis represents the jitter power and the x-axis the jitter frequency.

Figure 4:
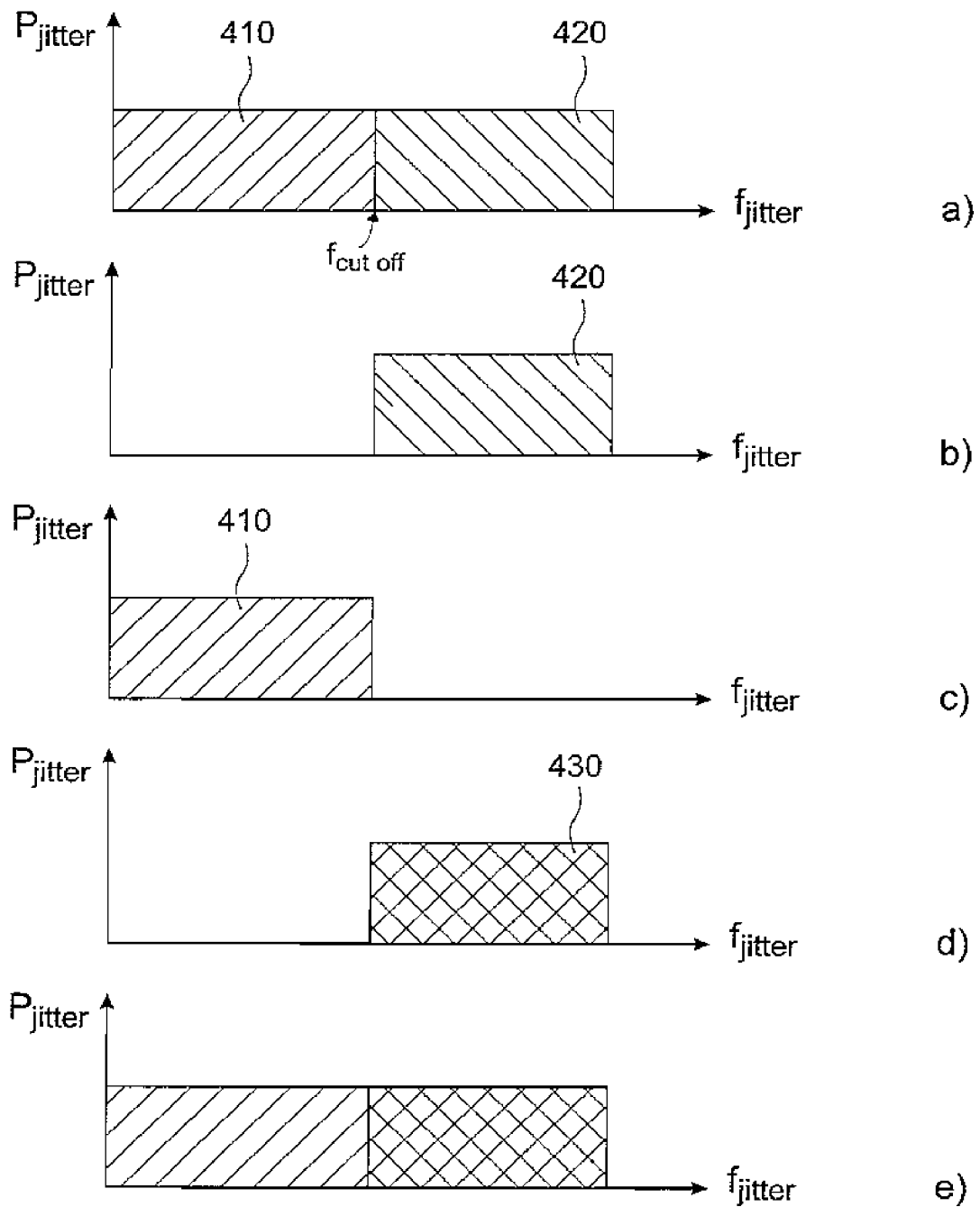
FIG. 4a to 4e illustrates schematically the function of a delay circuit of a receiver according to an embodiment of the invention in the frequency domain.

FIG. 4a shows the whole frequency spectrum of the jitter signal of the clock channel signal c at the input of the receiver 120. It comprises a low frequency spectrum 410 and a high frequency spectrum 420.

FIG. 4b shows the high frequency jitter spectrum that has been extracted by means of a high pass filter with the cut-off frequency $f_{cutoff}$ from the clock channel signal c. As an example, the high frequency jitter spectrum 420 could be the output signal of the phase detector 520 of FIG. 5.

FIG. 4c shows the low pass filtered low frequency jitter spectrum 410 of the clock channel signal c. As an example, the low frequency jitter spectrum 410 could be the output signal of the VCO 540 of FIG. 5.

FIG. 4d shows a delayed high frequency jitter spectrum 430. This delayed high frequency jitter spectrum 430 corresponds to the high frequency jitter spectrum 420 of FIG. 4b, but has been delayed by the propagation delay time difference $\tau_d$ between the clock channel 130 and the data channel 140. This is indicated by the different hatching. As an example, the delayed high frequency jitter spectrum 430 could be the output signal of the FIFO 550 of FIG. 5.

FIG. 4e shows the jitter spectrum of the receiver clock signal c' comprising the delayed high frequency jitter spectrum 430 and the non-delayed low frequency jitter spectrum 410. As an example, the jitter spectrum of FIG. 4e could be the output signal of the controllable delay 570 of FIG. 5.

Figure 5:
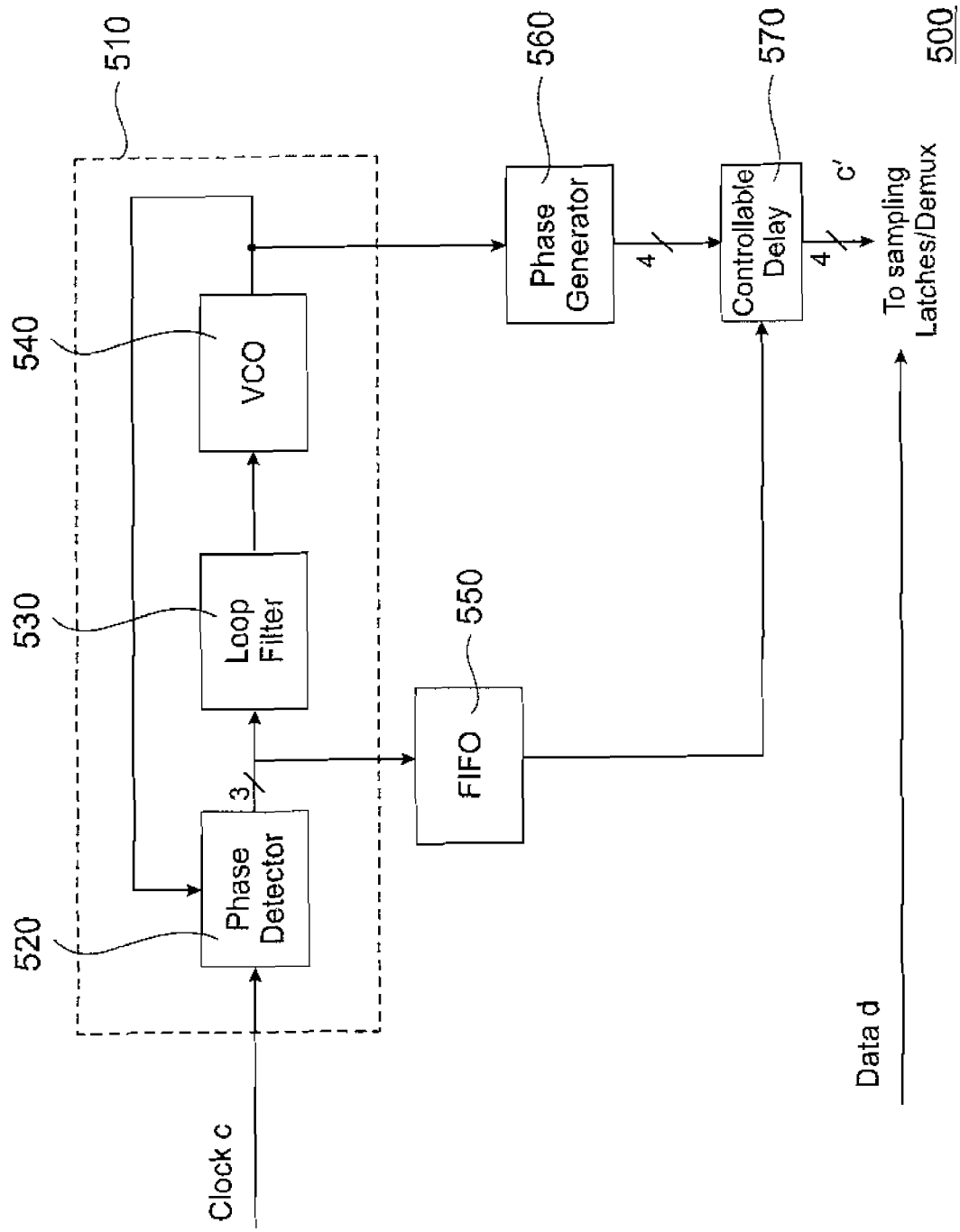
FIG. 5 shows a block diagram of a receiver according to an embodiment of the invention.

FIG. 5 shows a block diagram of a receiver 500 according to an embodiment of the invention. The receiver 500 comprises a phase locked loop (PLL) 510 with a phase detector 520, a loop filter 530 and a voltage controlled oscillator (VCO) 540. The phase detector 520 receives as input signals the clock channel signal c and the output signal of the voltage controlled oscillator 540. The phase detector 520 delivers as output signal the extracted high frequency spectrum of the jitter signal. The phase detector 520 works as high pass filter for the clock channel signal c.

The difference signal of the clock channel signal c and the extracted, but non-delayed jitter signal is derived from the output of the VCO 540. This difference signal is the low pass filtered clock channel signal. With respect to the output signal of the VCO 540, the PLL 510 functions as low pass filter for the clock channel signal c.

The output signal of the phase detector 520 is coupled to the input of a FIFO shift register 550 which works as a coarse delay unit. The FIFO shift register 550 performs a coarse delay of the extracted jitter signal. The FIFO 550 can be implemented analog or digital. The delay of the FIFO 550 should preferably correspond to the propagation delay time difference $\tau_d$ of the clock channel 130 and the data channel 140.

The output signal of the VCO 540 is provided to a phase generator 560 that generates multiple phases for a not shown sampling unit. The output phases of the phase generator 560 are provided as input signal to a controllable delay buffer 570. Furthermore the controllable delay buffer 570 receives as control input the extracted and coarse delayed jitter signal from the FIFO 550. The controllable delay buffer 570 adds the extracted and coarse delayed jitter signal to the output phases of the phase generator 560. Then the output of the controllable delay buffer 570 is provided as receiver clock signal c' to a not shown sampling unit, e.g. of the main receiver circuit 195 of FIG. 1.

Figure 6:
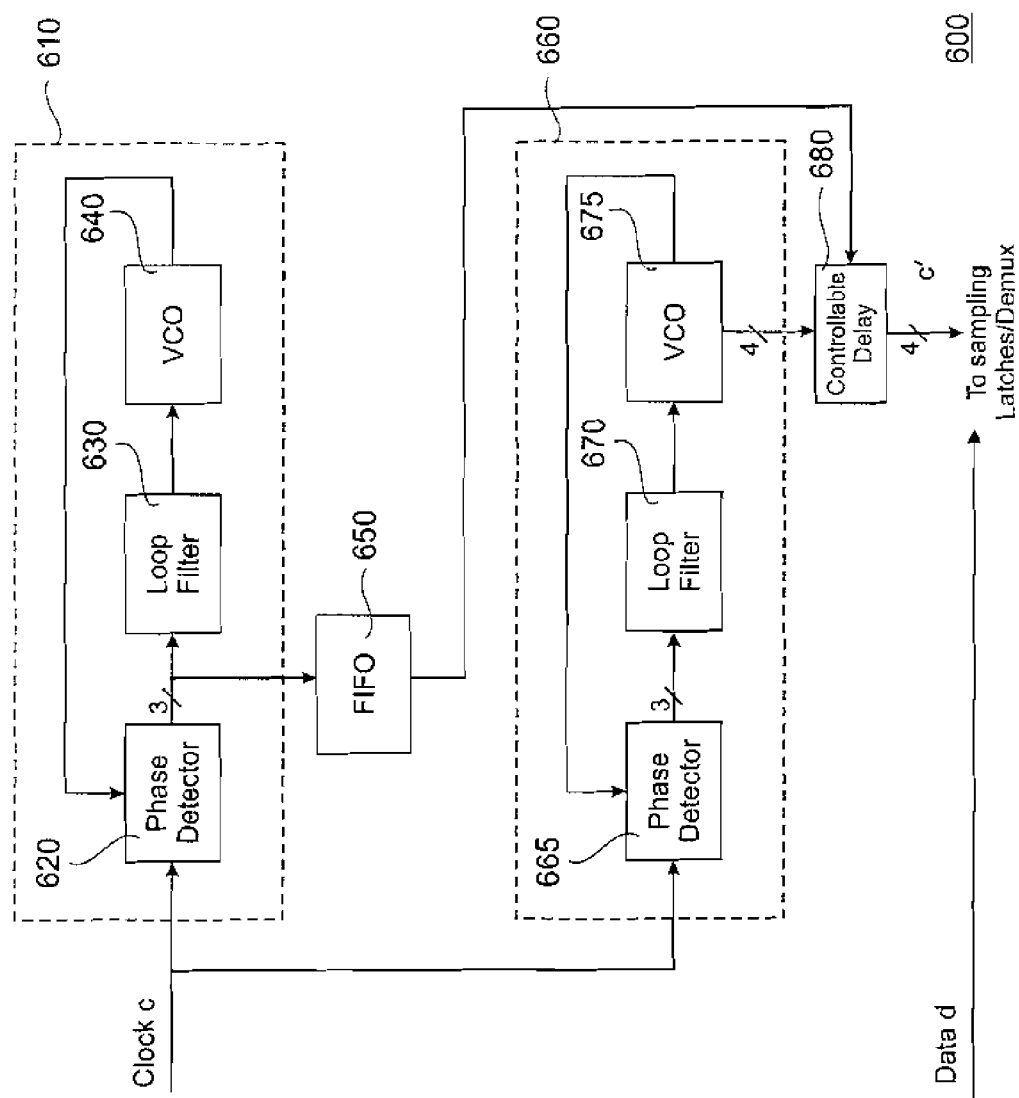
FIG. 6 shows a block diagram of another receiver according to an embodiment of the invention.

FIG. 6 shows a block diagram of another receiver 600 according to an embodiment of the invention.

The receiver 600 comprises a first phase locked loop (PLL) 610 with a phase detector 620, a loop filter 630 and a voltage controlled oscillator (VCO) 640. The phase detector 620 receives as input signals the clock channel signal c and the output signal of the voltage controlled oscillator 640. The phase detector 620 delivers as output signal the extracted high frequency spectrum of the jitter signal. The phase detector 620 works as high pass filter for the clock channel signal c.

The output signal of the phase detector 620 is coupled to the input of a FIFO shift register 650 which works as a coarse delay unit. The FIFO shift register 650 performs a coarse delay of the extracted jitter signal. The delay of the FIFO 650 should preferably correspond to the propagation delay time difference of the clock channel 130 and the data channel 140.

The receiver 600 comprises a second phase locked loop (PLL) 660 with a phase detector 665, a loop filter 670 and a voltage controlled oscillator (VCO) 675. The phase detector 665 receives as input signals the clock channel signal c and the output signal of the voltage controlled oscillator 675.

The first PLL 610 and the second PLL 660 have identical or very similar characteristics and receive both the clock channel signal c as input signal. Hence the VCO output signals of the first PLL 610 and the second PLL 660 are very similar or identical as well. The second PLL 660 serves hence as duplication stage or duplication unit for the first PLL 610.

The difference signal of the clock channel signal c and the extracted, but non-delayed jitter signal is derived from the output of the VCO 675. This difference signal is the low pass filtered clock channel signal. With respect to the output signal of the VCO 675, the PLL 660 functions as low pass filter for the clock channel signal c.

The output signal of the VCO 675 is provided as input signal to a controllable delay buffer 680. Furthermore the controllable delay buffer 680 receives as control input the extracted and coarse delayed jitter signal from the FIFO 650. The controllable delay buffer 680 adds the extracted and coarse delayed jitter signal to the output signal of the VCO 675. Then the output of the controllable delay buffer 680 is provided as receiver clock signal c' to a not shown sampling unit, e.g. of the main receiver circuit 195 of FIG. 1.

FIG. 7 shows a mathematical model of the receiver of FIG. 5.

The propagation delay time difference $\tau_d$, also denoted as timing skew, between the clock channel 130 and the data channel 140 is denoted in this example with $\Delta T$. H(s) denotes the transfer function of the PLL 510.

The signal difference between the data channel signal d and the receiver clock channel signal c' as provided by the receiver 500 of FIG. 5 is $$D - C' = (1 - e^{-s\Delta T})H(s)$$

The disclosed embodiments may be combined with one or several of the other embodiments shown and/or described. This is also possible for one or more features of the embodiments.

ADDITIONAL EMBODIMENT DETAILS

The described techniques may be implemented as a method, apparatus or article of manufacture involving software, firmware, micro-code, hardware and/or any combination thereof. The term "article of manufacture" as used herein refers to code or logic implemented in a medium, where such medium may comprise hardware logic [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CD-ROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.]. Code in the computer readable medium is accessed and executed by a processor. The medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed. Of course, those skilled in the art will recognize that many modifications may be made without departing from the scope of embodiments, and that the article of manufacture may comprise any information bearing medium. For example, the article of manufacture comprises a storage medium having stored therein instructions that when executed by a machine results in operations being performed.

Certain embodiments can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, certain embodiments can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself. Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

The invention claimed is:

1. A source-synchronous data communication system comprising:
   a transmitter;
   a receiver; and
   a clock channel and a data channel coupling the transmitter and the receiver, wherein the clock channel is shorter than the data channel, and wherein the receiver comprises a delay circuit for extracting a jitter signal from a clock channel signal, delaying the extracted jitter signal, and generating a receiver clock signal for the receiver by means of the delayed jitter signal.

2. The communication system according to claim 1, wherein the extracted jitter signal is delayed by a propagation delay time difference of the clock channel and the data channel.

3. The communication system according to claim 1, wherein one or more parts of the jitter spectrum are extracted from the clock channel signal as a jitter signal and wherein the receiver clock signal is generated by means of adding delayed parts of the jitter spectrum to a difference signal of the clock channel signal and the non-delayed extracted jitter signal.

4. The communication system according to claim 3, wherein a high frequency spectrum is extracted from the clock channel signal as a jitter signal by means of a high pass filter.

5. The communication system according to claim 4, wherein a cut-off frequency of the high pass filter is selected in dependence on propagation delay time difference between the clock channel and the data channel.

6. The communication system according to claim 1, wherein substantially the whole jitter spectrum is extracted from the clock channel signal as a jitter signal and wherein the receiver clock signal is generated by means of adding the extracted jitter spectrum to a clock reference signal.

7. The communication system according to claim 1, wherein the high pass filter is implemented as a phase locked loop comprising a phase detector, a loop filter and a voltage controlled oscillator, wherein the phase detector is provided for receiving the clock channel signal and for delivering the extracted jitter signal as an output signal.

8. The communication system according to claim 7, wherein a difference signal of the clock channel signal and a non-delayed extracted jitter signal is derived from the voltage controlled oscillator of the phase locked loop.

9. The communication system according to claim 7, wherein the delay circuit comprises an injection unit for injecting the extracted and delayed jitter signal to a control voltage of the voltage controlled oscillator.

10. The communication system according to claim 1, wherein the delay circuit comprises a coarse delay unit for performing a coarse delay of the extracted jitter signal.

11. The communication system according to claim 1, wherein the delay circuit comprises a controllable delay buffer for adding the extracted and delayed jitter signal to one of a difference signal and a clock reference signal.

12. A receiver for a source-synchronous communication system, wherein the receiver comprises a delay circuit and wherein the delay circuit is provided for:
    extracting a jitter signal from a received clock channel signal,
    delaying the extracted jitter signal, and
    generating a receiver clock signal for the receiver by means of the delayed jitter signal.

13. A method for synchronizing a clock channel signal and a data channel signal of a source-synchronous communication system, wherein the clock channel and the data channel comprise a propagation delay time difference, the method comprising the steps of:
    receiving a clock channel signal and a data channel signal,
    extracting a jitter signal from the received clock channel signal,
    delaying the extracted jitter signal, and
    generating a receiver clock signal by means of the delayed jitter signal.

* * * * *